(12) United States Patent
Golonzka et al.

(10) Patent No.: US 7,314,836 B2
(45) Date of Patent: Jan. 1, 2008

(54) ENHANCED NITRIDE LAYERS FOR METAL OXIDE SEMICONDUCTORS

(75) Inventors: Oleg Golonzka, Beaverton, OR (US); Ajay K. Sharma, Beaverton, OR (US); Nadia M. Rahhal-Orabi, Hillsboro, OR (US); Anthony St. Amour, Portland, OR (US); James S. Chung, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 168 days.

(21) Appl. No.: 10/881,052

(22) Filed: Jun. 30, 2004

(65) Prior Publication Data

US 2006/0003597 A1  Jan. 5, 2006

(51) Int. Cl.
*H01L 21/31* (2006.01)

(52) U.S. Cl. .................. 438/761; 438/763; 438/791; 257/E21.002

(58) Field of Classification Search .............. 438/758, 438/761, 763, 778, 786, 787, 791
See application file for complete search history.

(56) References Cited

U.S. PATENT DOCUMENTS

| | | | |
|---|---|---|---|
| 6,174,775 B1* | 1/2001 | Liaw | 438/283 |
| 6,573,172 B1* | 6/2003 | En et al. | 438/626 |
| 2003/0040158 A1* | 2/2003 | Saitoh | 438/279 |
| 2004/0104405 A1* | 6/2004 | Huang et al. | 257/199 |
| 2004/0113217 A1* | 6/2004 | Chidambarrao et al. | 257/415 |
| 2005/0230756 A1* | 10/2005 | Chang et al. | 257/351 |

\* cited by examiner

*Primary Examiner*—Scott B. Geyer
(74) *Attorney, Agent, or Firm*—Blakely, Sokoloff, Taylor & Zafman LLP

(57) ABSTRACT

The performance of NMOS and PMOS regions of integrated circuits is improved. Embodiments of the invention include forming a first dielectric layer optimized for n-doped regions over the n-doped regions and forming a second dielectric layer optimized for p-doped regions over p-doped regions.

17 Claims, 6 Drawing Sheets

ENHANCED NITRIDE LAYERS FOR METAL OXIDE SEMICONDUCTORS

BACKGROUND

1. Field

Embodiments of the invention apply to semiconductor device manufacture and, more particularly, to applying nitride layers to enhance transistor performance.

2. Background

In the fabrication of MOS (Metal Oxide Semiconductor) transistors, nitride film, such as $Si_3N_4$, is often used as a first layer in a dielectric stack separating transistors from the upper metal layers of a die. The nitride layer is used as a contact NESL (Nitride Etch Stop Layer). The stress properties of the nitride film influence the performance of the MOS transistors by straining the silicon in the transistor channel.

A highly tensile NESL will enhance the performance of NMOS (N-channel Metal Oxide Semiconductor) transistors but degrade the performance of PMOS (P-channel Metal Oxide Semiconductor) transistors. Higher stressed tensile NESL yields greater enhancements for NMOS devices and also creates greater corresponding degradation in PMOS performance. On the other hand, a compressive NESL will enhance the performance of PMOS transistors and degrade the performance of NMOS transistors. Similarly a higher stress compressive layer yields a greater improvement in PMOS and a greater degradation in NMOS performance.

In a circuit with both PMOS and NMOS transistors, tensile NESL has been used to enhance NMOS performance. The negative effect of the tensile NESL on PMOS performance has been reduced by engineering PMOS source and drain regions to isolate the PMOS channel from the stresses of adjacent nitride films. This approach may work well with moderate stress tensile films. However, as the intrinsic tensile stress of the film increases, the isolation may be overcome or become too large or complex. As a result, the amount of stress of the tensile NESL is limited by the impact on PMOS devices. The improvement in NMOS performance is also limited.

BRIEF DESCRIPTION OF THE DRAWINGS

Embodiments of the present invention will be understood more fully from the detailed description given below and from the accompanying drawings of various embodiments of the invention. The drawings, however, should not be taken to be limiting, but are for explanation and understanding only.

DETAILED DESCRIPTION

In MOS transistors, the performance of N-channel and P-channel devices may be modulated by the intrinsic stress of a corresponding contact etch stop layer, such as a NESL (Nitride Etch Stop Layer). NMOS devices benefit from tensile NESL while PMOS devices benefit from compressive NESL. The greater the stress, the greater the benefit. By applying the appropriate type of NESL over a wafer surface that contains both NMOS and PMOS devices, the performance of the overall circuit may be improved.

Figure 1:
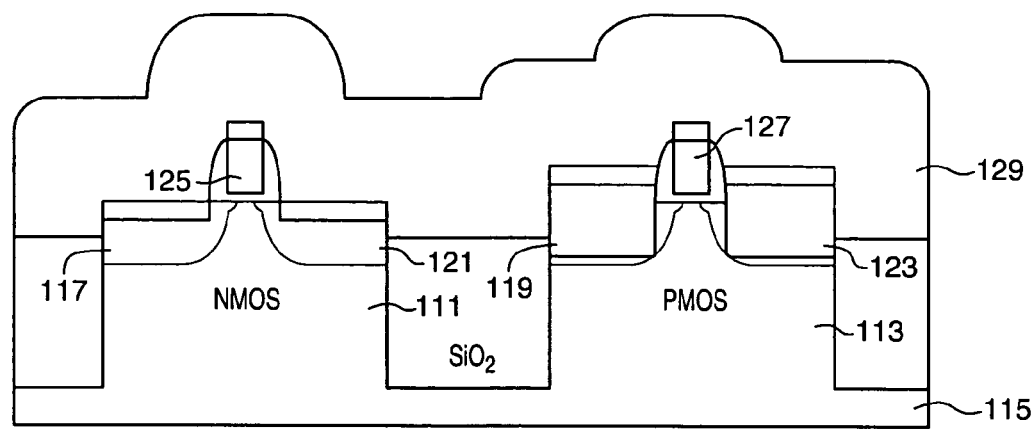
FIG. 1 is a cross-sectional diagram of an NMOS and a PMOS transistor device suitable for application of a first embodiment of the present invention.

In one embodiment of the invention, the performance of different devices is optimized by forming a tensile NESL over NMOS devices and a compressive NESL over PMOS devices. FIG. 1 is a cross-sectional diagram of an NMOS 111 and a PMOS 113 transistor device side-by-side on a silicon substrate 115. Each transistor has a source region 117, 119, a drain region 121, 123 and a gate region 125, 127. Note that the layers and formations in the drawing figures are not necessarily to scale, but are intended to aid in understanding the embodiments described.

A tensile NESL 129 has been formed over both transistors. Such a film may be formed with CVD (Chemical Vapor Deposition) or in a diffusion furnace. The NESL film may be uniform across all of or a portion of the wafer, for example, the NESL film may be blanket deposited over the wafer. Both the NMOS and PMOS devices are covered with the same thickness and stress characteristic film. However, the film may have inconsistencies due to process variations or other design concerns. In one example, the NESL film is a tensile nitride ($Si_3N_4$) film that is roughly 1250 angstroms thick. Other types of dielectrics, including nitride or oxynitride (SiON) films may alternatively be used.

The tensile layer may have any thickness that provides a sufficient enhancement in carrier mobility. For typical NMOS devices in microcontrollers, such layers are about 500-1500 Angstroms but the layer may be as thin as 300 Angstroms and may be much thicker than 1500 Angstroms. If the layer is made of a material other than nitride, the thickness may be different.

The nitride layer is formed with or is modified to have a tensile stress that together with the layer thickness provides the desired carrier mobility enhancement. For a 1250 Angstrom thick nitride layer, intrinsic stress of about $1.5\ e^{10}$ dynes/cm$^2$ or more may provide a significant NMOS performance improvement. Any stress greater than about $0.5\ e^{10}$ dynes/cm$^2$ may have a measurable beneficial effect. However, lesser amounts of stress may be preferred for particular applications.

The particular devices shown are provided as an example of one embodiment of the present invention. Two devices are shown for illustration purposes, while embodiments of the invention may be applied to systems with hundreds, thousands or millions of devices. Embodiments of the present invention may be applied to many different devices and in many different configurations. While only two devices are shown, embodiments of the invention may be applied to many different types and kinds of devices in many different configurations. Such devices include different MOS devices, bipolar devices and FET (Field Effect Transistor) devices.

The structures shown in FIG. 1 may be formed in any of a variety of ways, many of which are well known in the art. Before the deposition of the tensile NESL, the wafers carrying the devices shown may be prepared using any of a variety of different earlier processes. These may include isolation, gate patterning, tip implantation, spacer processing, source/drain processing and silicide processing, and many other processes.

Figure 2:
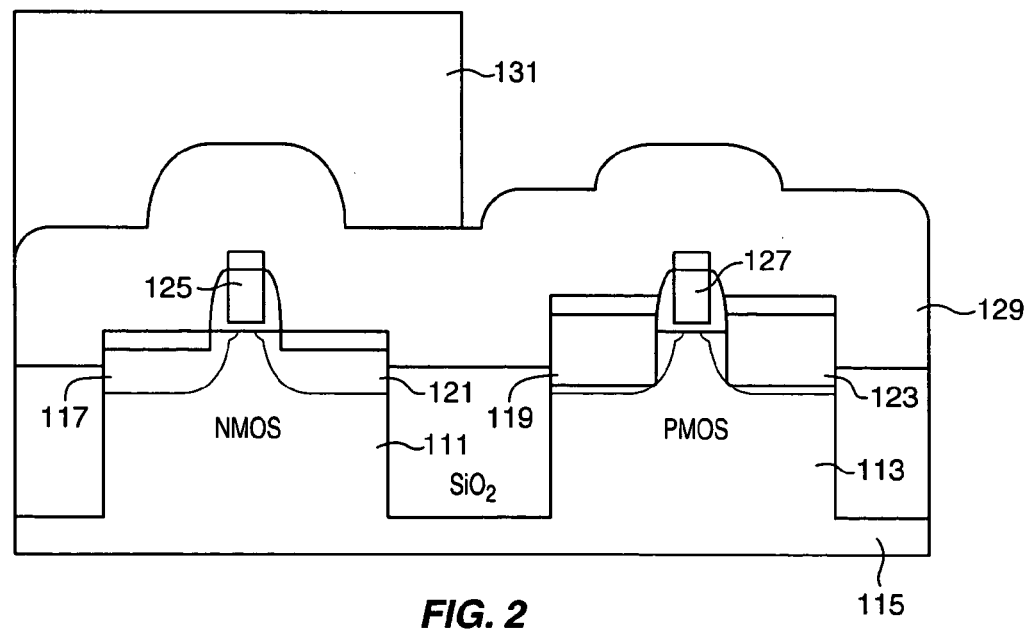
FIG. 2 is a cross-sectional diagram of the devices of FIG. 1 with a patterning sequence applied to cover NMOS regions by resist.

Referring to FIG. 2, a patterning sequence is applied to cover the NMOS regions by resist 131. The patterning process may include spinning photoresist, etching, and developing the resist. However, any of a variety of different processes may be used. The photoresist is applied with a thickness and composition to provide the optical resolution and thickness to withstand the processes described below.

Figure 3:
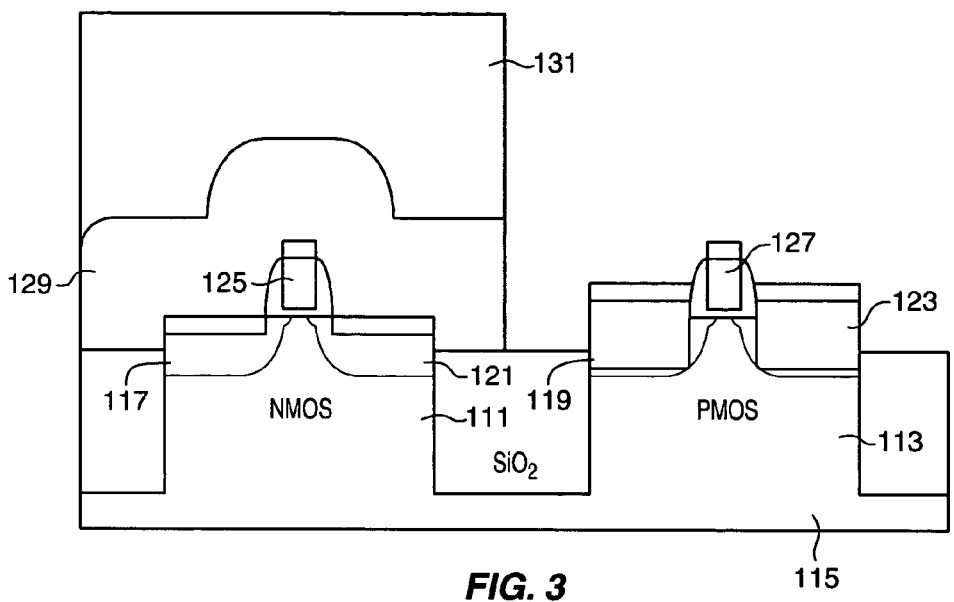
FIG. 3 is a cross-sectional diagram of the devices of FIG. 1 with an NESL film etched off of PMOS regions.

In FIG. 3, the NESL film has been etched off of the PMOS portions of the wafer. A dry etch or any other type of etching may be used as appropriate for the NESL.

Figure 4:
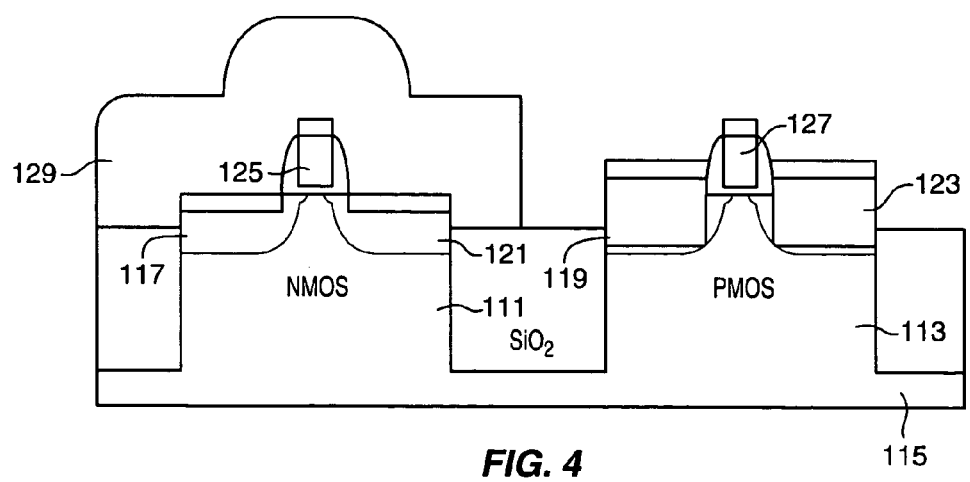
FIG. 4 is a cross-sectional diagram of the devices of FIG. 1 with resist removed from NMOS regions.

In FIG. 4, the resist is removed from the NMOS portions of the wafer and any other desired portions. In one embodiment, the etch resist has been ashed and the wafer has been wet cleaned.

Figure 5:
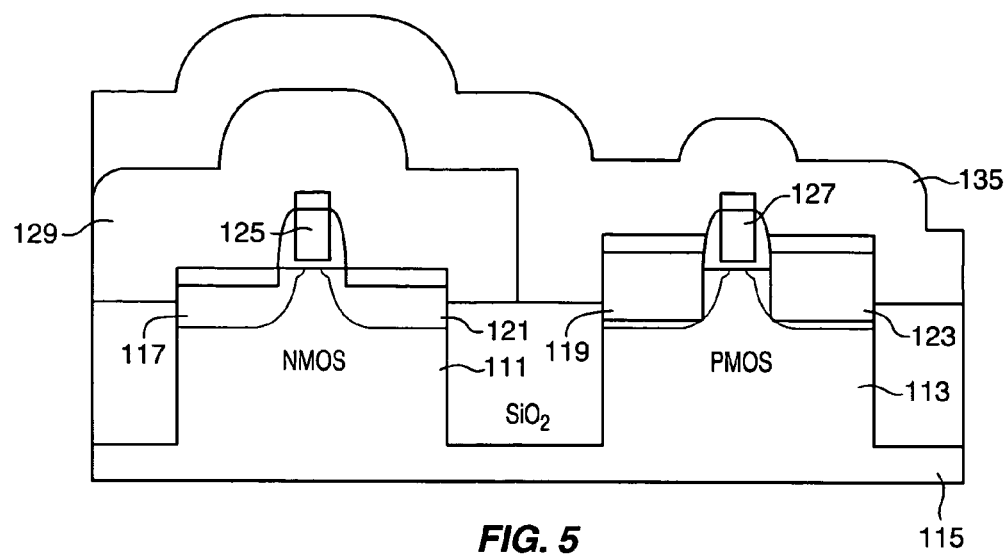
FIG. 5 is a cross-sectional diagram of the devices of FIG. 1 with a high stress compressive NESL film deposited across the wafer.

In FIG. 5 a high stress compressive NESL film 135 has been deposited across the wafer. The compressive NESL may be applied using any of a variety of different processes, including CVD and furnace diffusion. The compressive NESL may be blanket deposited across the wafer or concentrated over the PMOS areas. The NMOS areas are isolated from the compressive NESL by the tensile NESL that remains over the NMOS areas. Due to this isolation, the tensile NESL may be optimized for NMOS performance and the compressive NESL may be optimized for PMOS performance. In one example the compressive film is about 900 angstroms thick. While the examples described herein relate to NESL, embodiments of the invention may be applied to other layers including dielectrics such as nitride and oxynitride layers used for many different purposes.

The particular thickness selected for the compressive layer may depend upon the particular circuit topography, driving currents and the nature of the devices involved. For transistors in a microcontroller, a thickness greater than 500 Angstroms, and for example, in the range of 500 to 2000 Angstroms or more may be effective.

The stress of the compressive layer will depend in part on its thickness and composition and may be selected to achieve the desired carrier mobility improvement. With the 900 Angstrom nitride layer stresses of about $1.0\ e^{10}$ dynes/cm$^2$ may be effective. However, higher stresses may be used and lower stresses down to about $0.3\ e^{10}$ dynes/cm$^2$ may be effective.

Figure 6:
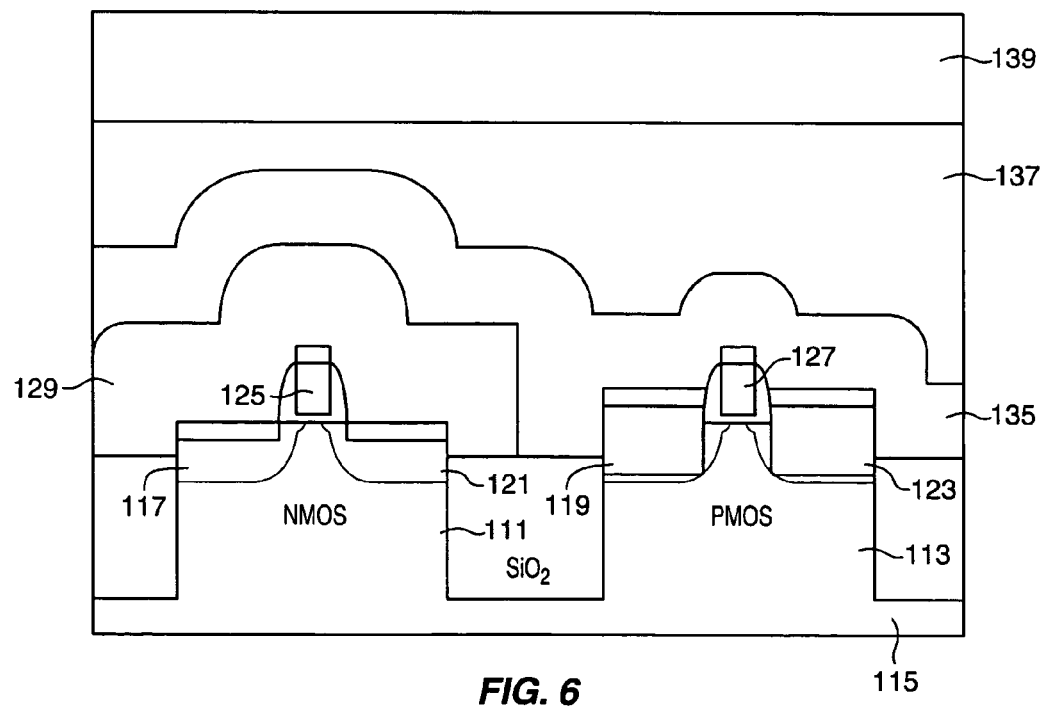
FIG. 6 is a cross-sectional diagram of the devices of FIG. 1 with a dielectric stack and cap according to the first embodiment of the invention.

In FIG. 6, the remaining layers are applied to complete fabrication of the IC (Integrated Circuit). These may be selected to suit any selected application. In one embodiment, an ILD0 (Inter-Layer Dielectric) stack 137 may be deposited and polished followed by the deposition of a cap oxide 139. Contact patterning and filling, including contacts through to each gate, may be applied or any of a variety of other processes, depending on the particular application for the circuits.

While the example of FIGS. 1 through 6 shows a tensile nitride layer being formed, then etched and a compressive NESL being formed over PMOS regions, the process may be reversed. In other words, a compressive NESL may be formed over the entire wafer, then etched over the NMOS regions. Then a tensile NESL may be formed over the NMOS regions. Other variations in the sequences described above may also be used to apply a layer over NMOS regions that is optimized for NMOS regions and a layer over PMOS regions that is optimized for PMOS regions.

Note also that in the examples provided above, a detrimental layer may be formed over a device, however, the detrimental layer is isolated from the device by a beneficial layer. So, for example, in FIG. 6, a compressive nitride layer is formed over the NMOS transistor but is isolated from the NMOS transistor by a tensile nitride layer. A similar result may be obtained by preventing the detrimental portion of each layer from forming. So, for example, the NMOS transistor could be isolated before the compressive layer is applied to so that the compressive layer is formed only over the PMOS layer.

Figure 7:
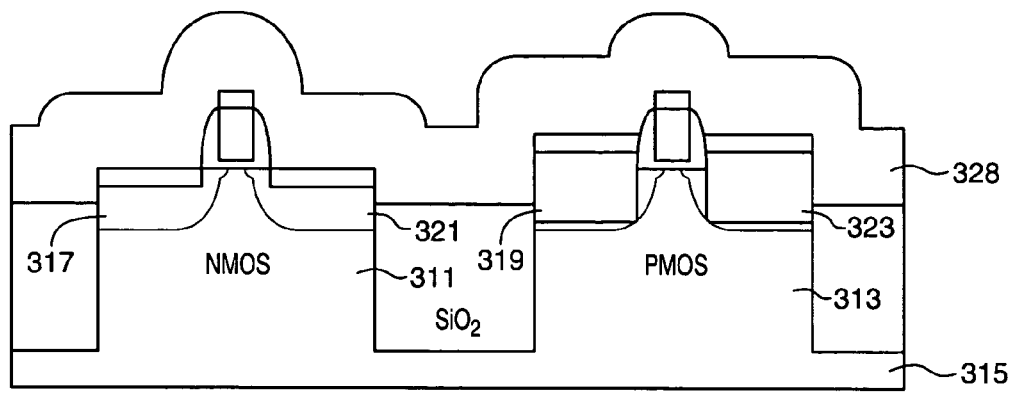
FIG. 7 is a cross-sectional diagram of an NMOS and a PMOS transistor device suitable for application of a second embodiment of the present invention.

In a second embodiment of the invention, a buffer layer of oxide or nitride may be deposited between MOS devices and a NESL film. For example, a nitride buffer layer may be deposited over PMOS areas, and then a highly tensile NESL may be applied over the wafer surface. The highly tensile NESL will enhance performance of NMOS areas while the buffer protects the PMOS areas from negative effects. FIG. 7 is a cross-sectional diagram of an NMOS 311 and a PMOS 313 transistor device side-by-side on a silicon substrate 315. Each transistor has a source region 317, 319, a drain region 321, 323 and a gate region 325, 327.

A buffer film 328 has been blanket deposited over both transistors. The buffer film may be a dielectric such as an oxide or a nitride film and may be uniform across all or a portion of the wafer. Both the NMOS and PMOS devices are covered with the same thickness and stress characteristic film. However, the film may have inconsistencies due to process variations and design considerations. The buffer film is selected to have no or little impact on the PMOS and NMOS devices.

In one example, the buffer film is a nitride (Si$_3$N$_4$) film roughly 900 angstroms thick with a tensile stress of about $4.5\ e^9$ dynes/cm$^2$. A nitride layer may be an effective buffer with any thickness of 300 Angstroms up to 1500 Angstroms or more. The stress may be less or more than that suggested depending on the impact on the devices that are to benefit from the buffer. While nitrides may be used as a buffer, any other buffer materials may be used including oxides, oxynitrides and silicon carbides.

Figure 8:
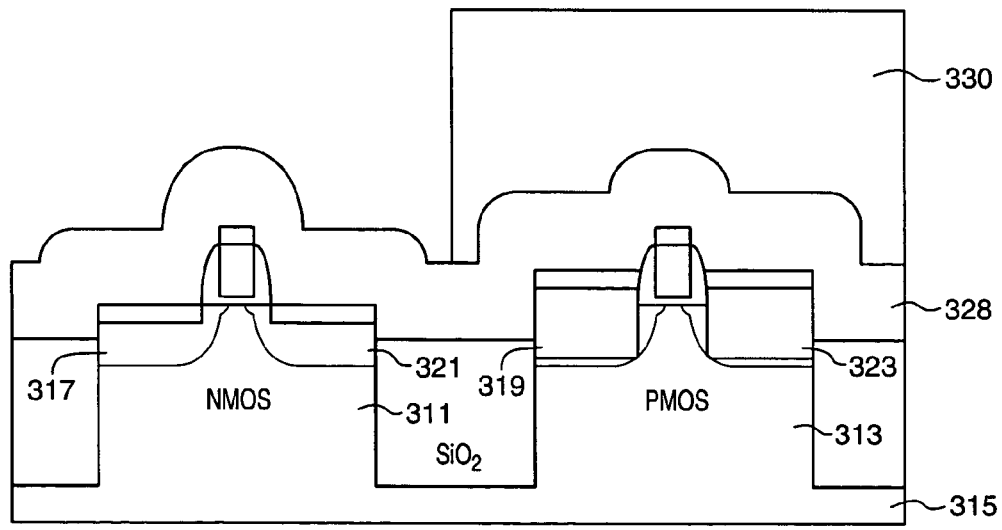
FIG. 8 is a cross-sectional diagram of the devices of FIG. 7 with a patterning sequence applied to cover the PMOS regions by resist.

Referring to FIG. 8, a patterning sequence is applied to cover the PMOS regions by resist 330. The patterning process may include spinning photoresist, and developing the resist. However, any of a variety of different patterning processes may be used. The photoresist is applied with a thickness and composition to provide the optical resolution and thickness to withstand the processes described below.

Figure 9:
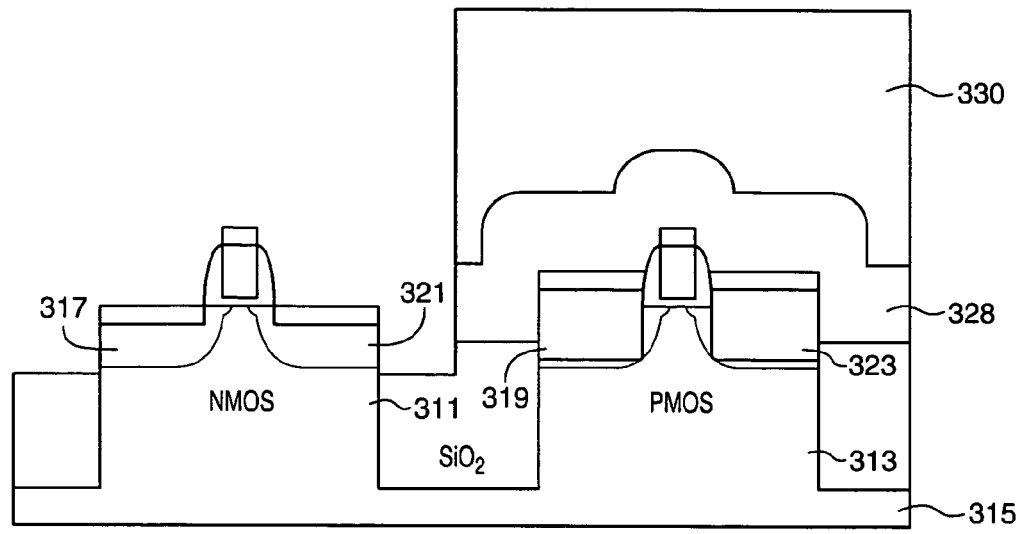
FIG. 9 is a cross-sectional diagram of the devices of FIG. 7 with a buffer film etched off of NMOS regions.

In FIG. 9, the buffer film has been etched off of the NMOS portions of the wafer. A dry etch or any other type of etching may be used as appropriate for the particular buffer layer selected.

Figure 10:
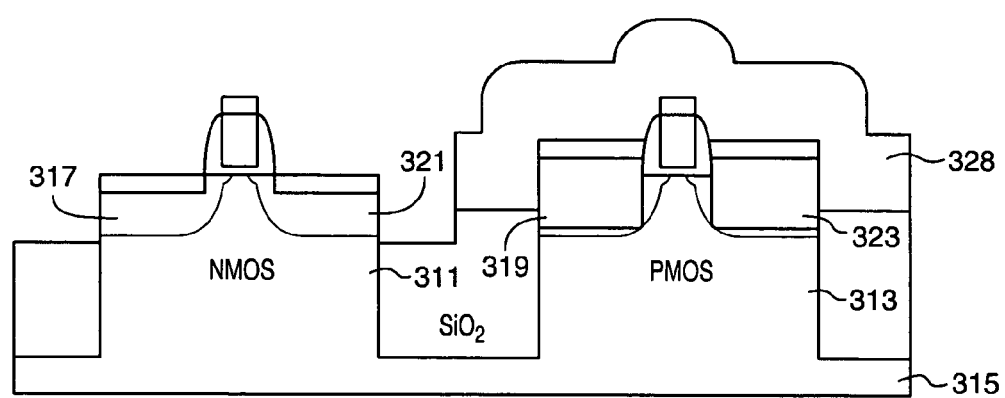
FIG. 10 is a cross-sectional diagram of the devices of FIG. 7 with resist removed from PMOS regions.

In FIG. 10, the resist is removed from the PMOS portions of the wafer and any other desired portions. In one embodiment, the etch resist has been ashed and the wafer has been wet cleaned.

Figure 11:
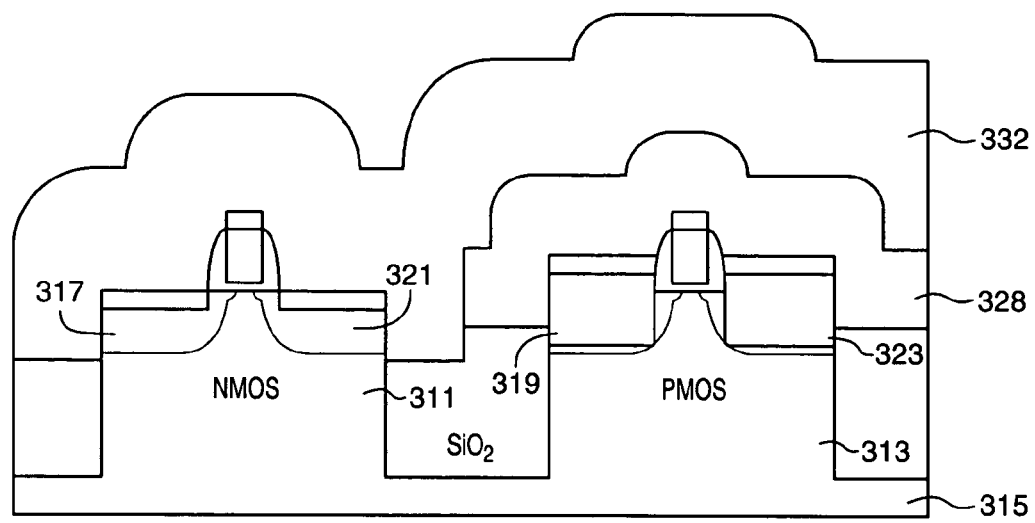
FIG. 11 is a cross-sectional diagram of the devices of FIG. 7 with a high stress tensile NESL film deposited across the wafer.

In FIG. 11, a high stress tensile NESL film 332 has been blanket deposited across the wafer. The tensile NESL may be applied using any of a variety of different processes and may be similar to the tensile NESL described above with respect to FIG. 1. The tensile NESL may be applied uniformly across the wafer or concentrated over the NMOS areas. The PMOS areas are isolated from the tensile NESL by the buffer layer that remains over the PMOS areas. Due to this isolation, the tensile NESL may be optimized for NMOS performance.

Figure 12:
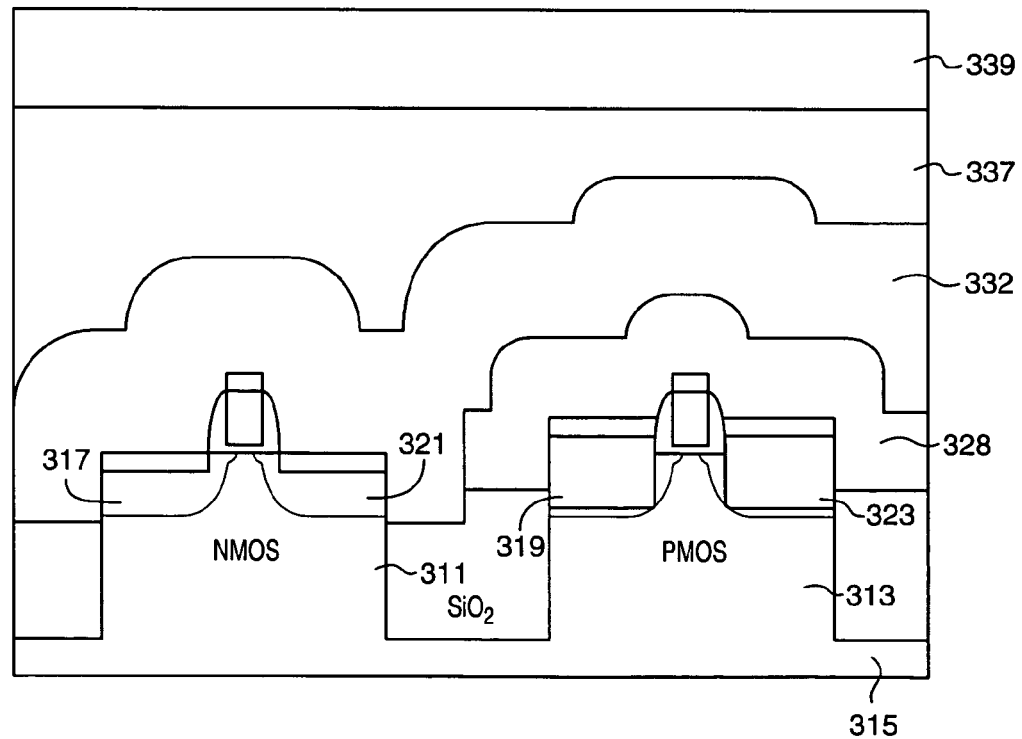
FIG. 12 is a cross-sectional diagram of the devices of FIG. 7 with a dielectric stack and cap according to the second embodiment of the invention.

In FIG. 12, the remaining layers are applied to complete fabrication of the IC. These may be selected to suit any selected application. In one embodiment, an ILD0 stack 337 may be deposited and polished followed by the deposition of a cap oxide 139. Contact patterning and filling may be applied or any of a variety of other processes, depending on the particular application for the circuits.

While the example of FIGS. 7-12 show a buffer layer over the PMOS devices and a tensile layer over the NMOS devices, the structure may be reversed. A similar buffer layer may be formed over the NMOS devices and a compressive NESL formed over the whole wafer.

Devices formed according to different embodiments of the present invention may be used in a wide range of different circuits. An application of embodiments of the present invention is in forming transistors for use in VLSI (Very Large Scale Integrated Circuits) that may be used in controllers, processors, hubs, DSPs (Digital Signal Processors), ASICs (Application Specific Integrated Circuit), memories and many other devices.

It is to be appreciated that a lesser or more complex semiconductor device, etch stop layer, integrated circuit, or chip than the examples described above may be preferred for certain implementations. Therefore, the configurations may vary from implementation to implementation depending upon numerous factors, such as price constraints, performance requirements, technological improvements, or other circumstances. Embodiments of the invention may also be applied to other types of systems that use different devices than those shown in the Figures.

In the description above, numerous specific details are set forth. However, it is understood that embodiments of the invention may be practiced without these specific details. For example, well-known equivalent materials may be substituted in place of those described herein, and similarly, well-known equivalent techniques may be substituted in place of the particular processing techniques disclosed. In other instances, well-known circuits, structures and techniques have not been shown in detail to avoid obscuring the understanding of this description.

While the embodiments of the invention have been described in terms of several embodiments, those skilled in the art will recognize that the invention is not limited to the embodiments described, but may be practiced with modification and alteration within the spirit and scope of the appended claims. The description is thus to be regarded as illustrative instead of limiting.

What is claimed is:

1. A method comprising:
    forming a buffer layer over n-doped regions of an integrated circuit having n-doped and p-doped regions;
    removing the buffer layer over the n-doped regions;
    forming a tensile nitride layer over the n-doped regions; and
    forming a compressive nitride layer over the p-doped regions.

2. The method of claim 1, wherein n-doped regions comprise n-type metal oxide semiconductor transistors and wherein the p-doped regions comprise p-type metal oxide semiconductor transistors.

3. The method of claim 1, wherein the tensile nitride layer comprises a nitride etch stop layer.

4. The method of claim 1, wherein the tensile nitride layer is mechanically coupled to the n-doped regions to apply a stress to the n-doped regions.

5. The method of claim 1, wherein forming a compressive nitride layer comprises removing the buffer layer over the p-doped regions and forming the compressive nitride layer over the p-doped regions.

6. A method comprising:
    forming a buffer layer over p-doped regions of an integrated circuit having n-doped and p-doped regions,
    forming a tensile nitride layer over n-doped regions and the buffer layer;
    forming a compressive nitride layer over the p-doped regions; and
    forming an inter-layer dielectric stack over the tensile nitride layer.

7. The method of claim 6, wherein forming the compressive nitride layer comprises removing the buffer layer over the p-doped regions and forming a compressive nitride layer over the p-doped regions.

8. The method of claim 6, wherein the compressive nitride layer is formed over the p-doped regions and the buffer layer.

9. The method of claim 6, wherein the tensile nitride layer is a nitride etch stop layer mechanically coupled to the n-doped regions to apply a stress to the n-doped regions.

10. The method of claim 6, further comprising removing the buffer layer over the p-doped regions and forming the compressive nitride layer over the p-doped regions.

11. The method of claim 6, wherein the n-doped regions comprise n-type metal oxide semiconductor transistors and wherein the p-doped regions comprise p-type metal oxide semiconductor transistors.

12. A method comprising:
    forming a buffer layer over the n-doped regions and the p-doped regions of an integrated circuit having n-doped regions and p-doped regions;
    forming a compressive nitride layer over the p-doped regions and the buffer layer;
    removing the buffer layer over the n-doped regions; and
    forming a tensile nitride layer over the n-doped regions; and
    forming an inter-layer dielectric stack over the tensile nitride layer.

13. The method of claim 12, wherein the forming the tensile nitride layer comprises forming a nitride etch stop layer.

14. The method of claim 12, wherein forming the compressive nitride layer comprises removing the buffer layer over the p-doped regions and forming a compressive nitride layer over the p-doped regions.

15. The method of claim 12, wherein the n-doped regions comprise n-type metal oxide semiconductor transistors and wherein the p-doped regions comprise p-type metal oxide semiconductor transistors.

16. A method comprising:
   forming a buffer layer over the n-doped regions and the p-doped regions of an integrated circuit having n-doped and p-doped regions;
   removing the buffer layer over the n-doped regions;
   forming a tensile nitride layer over the n-doped regions; and
   forming a compressive nitride layer over the p-doped regions.

17. The method of claim 16, wherein the tensile nitride layer is mechanically coupled to the n-doped regions to apply a stress to the n-doped regions.

* * * * *